United States Patent
Oki et al.

(10) Patent No.: US 9,879,358 B2
(45) Date of Patent: Jan. 30, 2018

(54) HEAT SHIELD RING FOR HIGH GROWTH RATE EPI CHAMBER

(71) Applicant: Applied Materials, Inc., Santa Clara, CA (US)

(72) Inventors: Shinichi Oki, Chiba-Ken (JP); Yuji Aoki, Yokohama (JP); Yoshinobu Mori, Ohmura (JP)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 15/164,610

(22) Filed: May 25, 2016

(65) Prior Publication Data

US 2016/0348275 A1 Dec. 1, 2016

Related U.S. Application Data

(60) Provisional application No. 62/166,912, filed on May 27, 2015.

(51) Int. Cl.
*H01J 37/34* (2006.01)
*C30B 25/10* (2006.01)
*C30B 25/12* (2006.01)
*C23C 16/458* (2006.01)

(52) U.S. Cl.
CPC .......... *C30B 25/10* (2013.01); *C23C 16/4585* (2013.01); *C30B 25/12* (2013.01)

(58) Field of Classification Search
CPC .............. Y10T 428/218; H01J 37/3441; H01J 37/32633; H01J 37/32623; C23C 16/4585
See application file for complete search history.

(56) References Cited

U.S. PATENT DOCUMENTS

| | | |
|---|---|---|
| 5,304,248 A | 4/1994 | Cheng et al. |
| 5,518,593 A | 5/1996 | Hosokawa et al. |
| 6,111,225 A | 8/2000 | Ohkase et al. |
| 2008/0178801 A1 | 7/2008 | Pavloff et al. |
| 2014/0190822 A1 | 7/2014 | Riker et al. |

*Primary Examiner* — Alexander Thomas
(74) *Attorney, Agent, or Firm* — Patterson + Sheridan, LLP

(57) ABSTRACT

A heat shield assembly for an epitaxy chamber is described herein. The heat shield assembly has a heat shield member and a preheat member. The heat shield member is disposed on the preheat member. The heat shield member has a cutout portion that exposes a portion of the preheat member. The preheat member has a recessed portion to receive the heat shield member.

19 Claims, 6 Drawing Sheets

HEAT SHIELD RING FOR HIGH GROWTH RATE EPI CHAMBER

CROSS-REFERENCE TO RELATED APPLICATIONS

This application claims benefit of U.S. Provisional Patent Application Ser. No. 62/166,912 filed May 27, 2015, which is incorporated herein by reference in its entirety.

FIELD

Embodiments of the present disclosure generally relate to apparatus for semiconductor processing. More specifically, embodiments described herein relate to heating components for an epitaxy chamber.

BACKGROUND

Epitaxy is a process commonly used in semiconductor processing to fabricate high quality materials with extremely uniform electrical properties for semiconductor devices. As semiconductor devices have grown smaller, and manufacturing units larger, the need for uniformity across a single manufactured substrate is extreme.

In a typical epitaxy chamber, process gases flow across a substrate from one side of the chamber to the other side, where exhaust gases are removed. The substrate typically rotates during processing to minimize the effect of non-uniformities, but persistent non-uniformities may nonetheless manifest as radial variation.

In a high-growth rate epitaxy chamber, the processing volume is typically very small a close to the susceptor on which the substrate is positioned. A quartz window is disposed over the processing volume to confine the process gases to the processing volume. The dome may be slightly curved at the edges where the dome meets the side of the chamber. As the dome curves toward the side of the chamber, the processing volume compresses, so the flow path for process gases near the edge of the substrate is very small. Consequently, the process gases flow at very high velocity.

The epitaxy chamber usually includes a pre-heat ring or ring assembly that circumnavigates the susceptor. The pre-heat ring assembly typically absorbs heat from heating elements below the susceptor and re-radiates that heat above the pre-heat ring assembly near the edge of the susceptor. The radiated heat increases the temperature of incoming process gases to a processing temperature before the gases reach the susceptor, and the substrate disposed thereon. This ensures reaction of gases with the substrate surface starting at the edge of the substrate.

With the compressed process volume and high gas flow rates near the side of the chamber, gas heating over the pre-heat ring assembly is compromised. Residence time over the pre-heat ring assembly may be insufficient to allow the process gases to above enough heat to activate for epitaxial growth at the edge of the substrate. Thus, growth at the edge of the substrate is reduced, and uniformity suffers.

There is a need for an apparatus to pre-heat process gases for epitaxy in a very high flow-rate situation.

SUMMARY

A heat shield assembly for an epitaxy chamber is described herein. The heat shield assembly has a heat shield member and a preheat member. The heat shield member is disposed on the preheat member. The heat shield member has a cutout portion that exposes a portion of the preheat member. The preheat member has a recessed portion to receive the heat shield member.

BRIEF DESCRIPTION OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In this disclosure, the terms "top", "bottom", "side", "above", "below", "up", "down", "upward", "downward", "horizontal", "vertical", and the like do not refer to absolute directions. Instead, these terms refer to directions relative to a basis plane of the chamber, for example a plane parallel to a substrate processing surface of the chamber.

Figure 1:
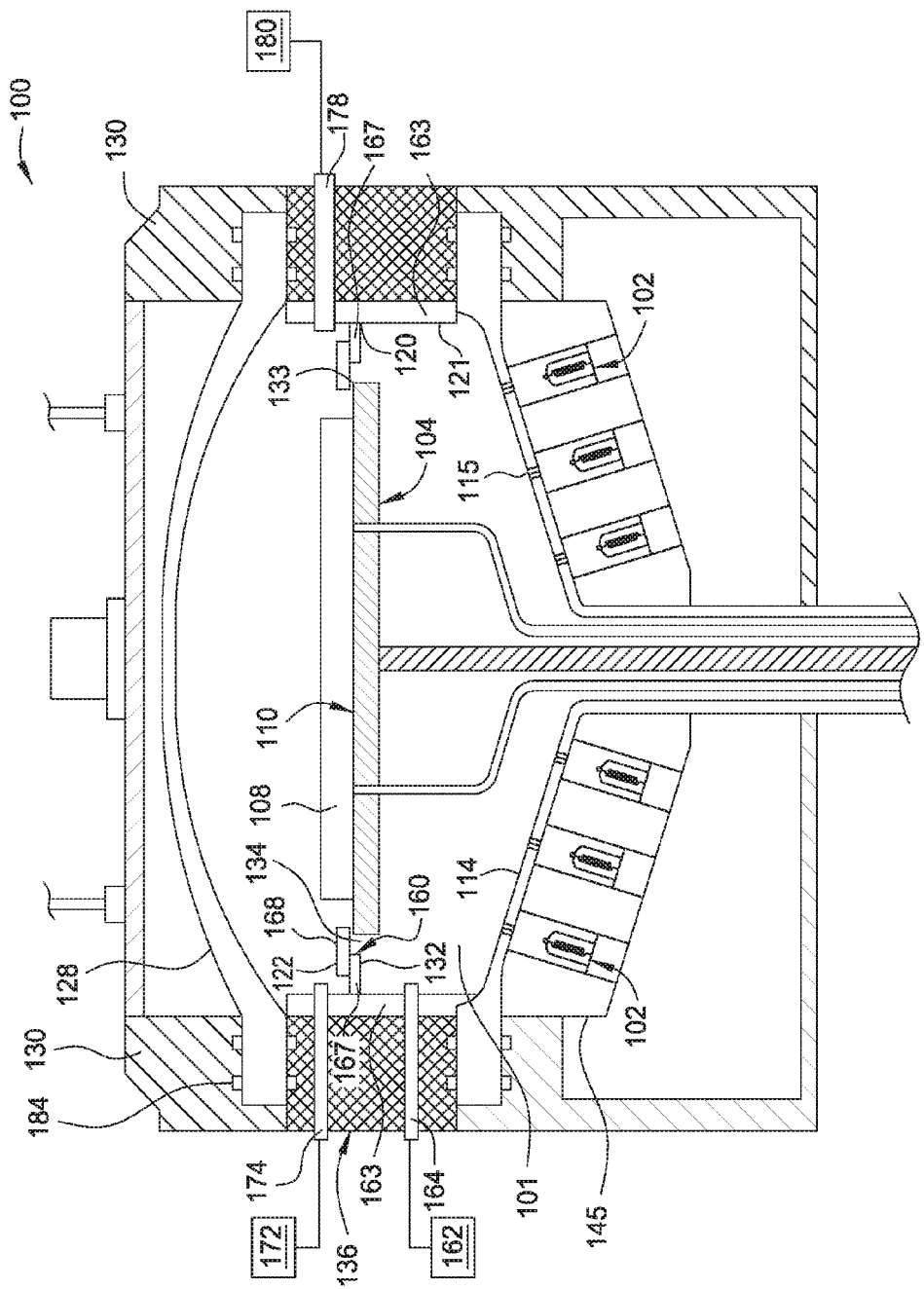
FIG. 1 is a schematic cross-sectional view of a process chamber according to one embodiment.

FIG. 1 is a schematic cross-sectional view of a processing chamber 100 according to one embodiment. The chamber 100 features an enclosure 101 with a substrate support 104 disposed therein. A substrate 108 is typically disposed on the substrate support 104 for processing the chamber 100. A process gas inlet 174 formed through a sidewall 136 of the process chamber 100, and through a liner 163 disposed in the process chamber 100, provides a pathway to flow process gases into the enclosure 101. Process gases flow from a source 172 of process gases through the process gas inlet 174 and across the upper surface of the substrate 108. The substrate support 104 may rotate the substrate during processing to improve uniformity. A process gas outlet 178 is disposed in the sidewall 136 and liner 163 opposite the process gas inlet 174 to allow process gases flowing across the substrate 108 to exit the chamber 100. A vacuum source 180 evacuates process gases from the chamber 100.

A dome 128 is disposed above the substrate support 104 and together with the substrate support 104 defines a process volume. A lid 130 holds the dome 128 in place.

Heat may be provided to the process using a heat module that may be located above or below the substrate support 104. In the chamber 100, a heat module 145 is provided below the substrate support 104. The heat module 145 comprises a housing 114, in which a plurality of heat sources 102 is disposed. The heat sources 102 may be any combination of lamps, LED's and lasers, and the heat module 145 may include optical elements 115, for example lenses, light pipes, and/or other reflective and refractive elements, that may be individually shaped to direct the energy emitted by a respective heat source 102 toward the substrate support 104. The heat from the heat module 145 heats the substrate support 104, which transfers heat to the substrate by conduction, if the substrate is mostly in contact with the substrate support 104, or by radiation if the substrate is mostly not in contact with the substrate support 104.

A heat shield assembly 160 surrounds the substrate support 104. The heat shield assembly 160 is an annular structure concentric with the substrate support 104. An outer radius 120 of the heat shield assembly 160 is less than an inner radius 121 of the liner 163 or the sidewall 136 of the chamber 100. An upper surface 122 of the heat shield assembly 160 is substantially coplanar with an upper surface 110 of the substrate support 104 to provide a uniformly flat surface for gas flow through the chamber 100.

The heat shield assembly 160 comprises a preheat member 167 and a heat shield member 168 (further described in more detail below). The preheat member 167 has an inner radius 132 that is larger than an outer radius 133 of the substrate support 104, together defining a gap 134 between the preheat member 167 and the substrate support 104. The heat shield member 168 at least partially covers the gap 134.

A source 162 of purge gas may be coupled to the chamber 100 to prevent intrusion of process gases through the gap 134 into lower portions of the chamber 100. Purge gas may flow from the source 162 through a purge gas conduit 164 to provide a positive pressure gas flow through the gap 134 to the process gas outlet 178.

Figure 2:
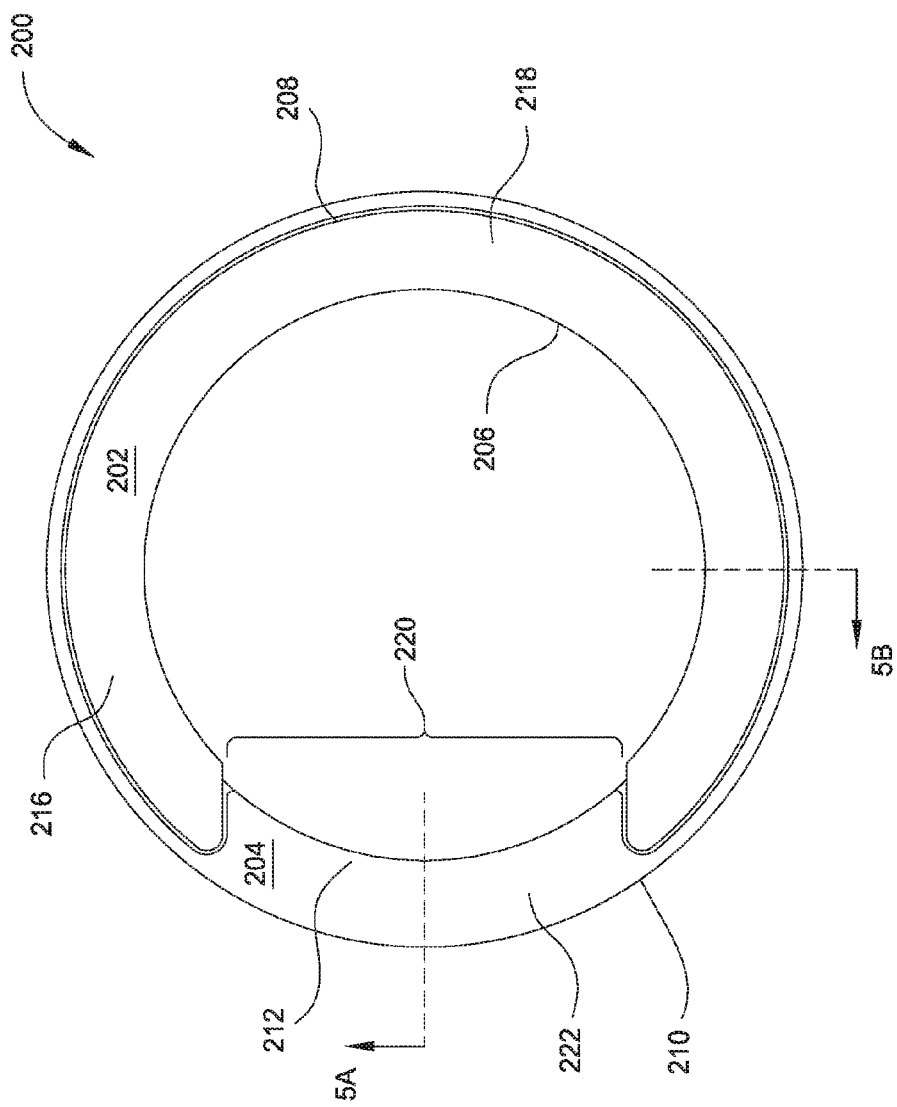
FIG. 2 is a top view of a heat shield assembly according to another embodiment.

FIG. 2 is a top view of a heat shield assembly 200 according to one embodiment. The heat shield assembly 200 may be used in the chamber 100 as, or in place of, the heat shield assembly 160. The heat shield assembly 200 comprises a preheat member 202 and a heat shield member 204. The heat shield member 202 is an annular member that rests on the preheat member 204, and has an inner radius 206 that extends inward to cover the gap 134, at least partially. Thus, an inner radius 212 of the preheat member 204 is larger than the inner radius 206 of the heat shield member. An outer radius 210 of the preheat member 204 is also larger than an outer radius 208 of the heat shield member 202.

Figure 3:
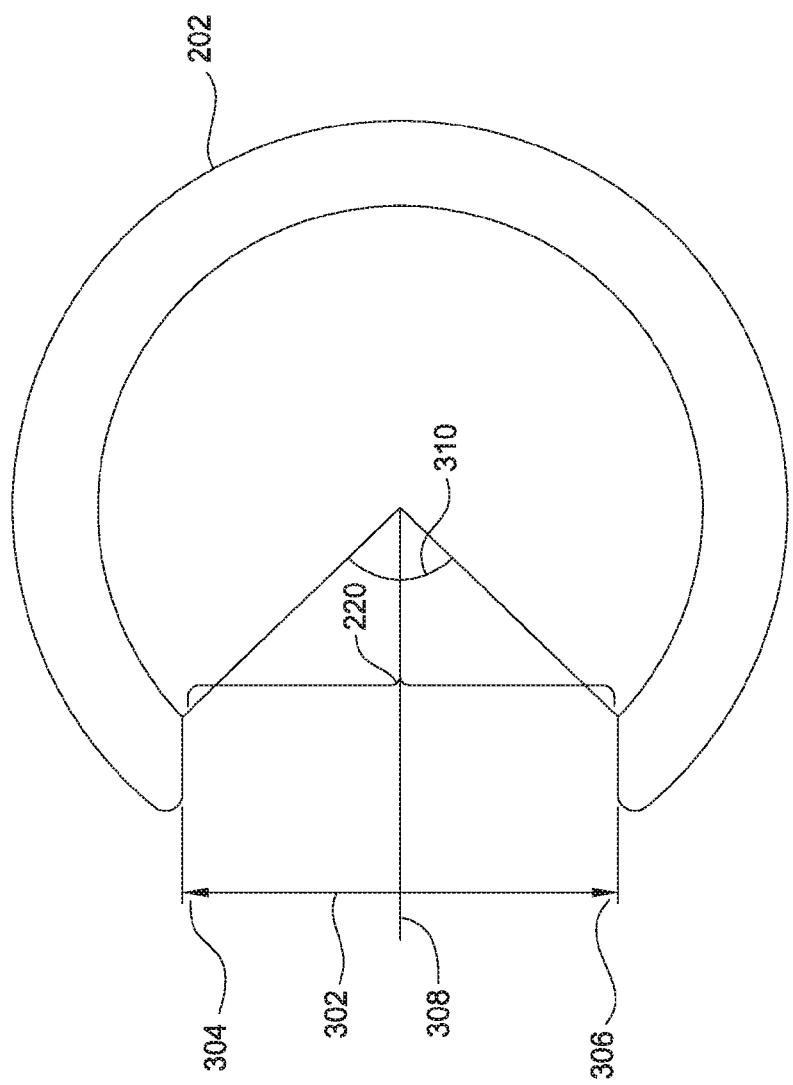
FIG. 3 is a top view of the heat shield member of the heat shield assembly of FIG. 2.

FIG. 3 is a schematic top view of the heat shield member 202. The heat shield member 202 has a gap 220 that exposes a portion 222 of the preheat member 204. The exposed portion 222 provides more direct heat exposure for gases flowing from the gas inlet 106 across the preheat member 204 to the substrate support 104. The inner radius 206 of the heat shield member 202 may be more than 150 mm to accommodate a substrate having a nominal diameter of 300 mm. For example, the inner radius 206 may be from about 151 mm to about 155 mm for a 300 mm substrate. The gap 220 may have a dimension, as shown by dimension indicator 302, selected to provide a desired amount of heat exposure to entering gases. The dimension 302 may be from about 50 mm to about 180 mm for the embodiment of FIG. 3. The gap 220 has a first edge 304 and a second edge 306. The first edge 304 and the second edge 306 are generally parallel to a radius 308 that bisects the angle 310 subtended by the gap 220 to promote uniform laminar gas flow. In other embodiments, the edges may have any desired directionality. For example, in some embodiments, the edges may be rounded. In other embodiments, each edge may be parallel to a radius that intersects with the respective edge.

One or more shape features 304 may be included in the heat shield member 202 to prevent movement of the heat shield member 202 during operation, as further described below. In the embodiment of FIG. 3, two outer corners on either side of the gap 220 are rounded as shape features. The rounded corners of the shape features 304 are circular in shape, but any desired shape may be added to the corners. In the embodiment of FIG. 3, the rounded corners have a radius of curvature of between about 0.01 mm and about 1.5 mm, such as between about 0.1 mm and about 1.0 mm, for example about 0.3 mm, 0.4 mm, or 0.5 mm.

Figure 4:
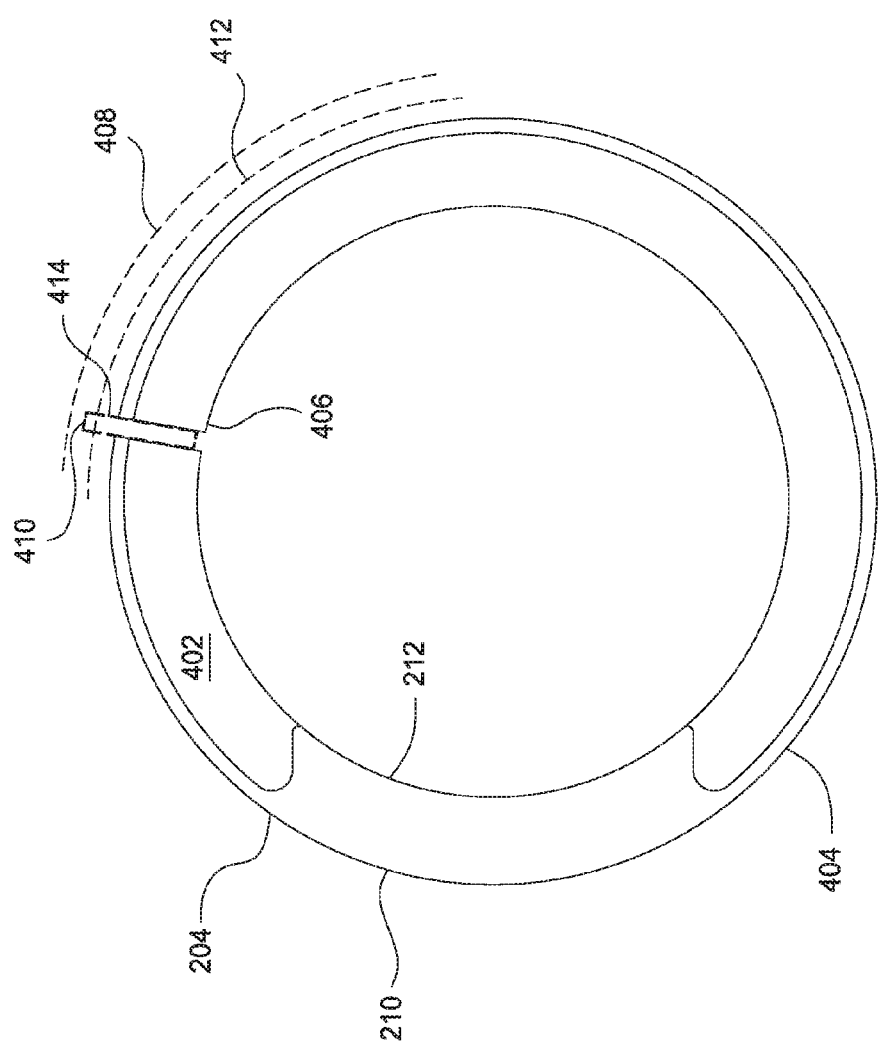
FIG. 4 is a top view of the preheat member of the heat shield assembly of FIG. 2.

FIG. 4 is a schematic top view of the preheat member 204 of FIG. 2. The preheat member 204 has a recessed portion 402 that is similar in shape to the heat shield member 202, such that the heat shield member 202 rests in the recessed portion 402 of the preheat member 204. A rim portion 404 of the preheat member 204 surrounds the recessed portion 402, and the heat shield member 202 when disposed in the recessed portion 402.

The preheat member 204 may have a gap 406. The gap 406 may be formed through the preheat member 204 from the outer radius 210 to the inner radius 212 thereof along any desired path, for example straight along a radius or along any curved path that may be desired. The gap 406 may provide stress relief for the preheat member 204 during thermal cycling. The gap 406 may also provide a locking mechanism to prevent movement of the preheat member 204 during processing. To illustrate a potential locking means, a chamber liner 408 is shown schematically in phantom in FIG. 4. The chamber liner 408 has a recess 410 form in an inner wall 412 thereof. A locking pin 414 is also shown in phantom. The locking pin 414 is inserted into the recess 410 and protrudes from the recess 410 into the chamber interior. The preheat member 204 may then be positioned such that the locking pin 414 extends through the gap 406.

Figure 5A:
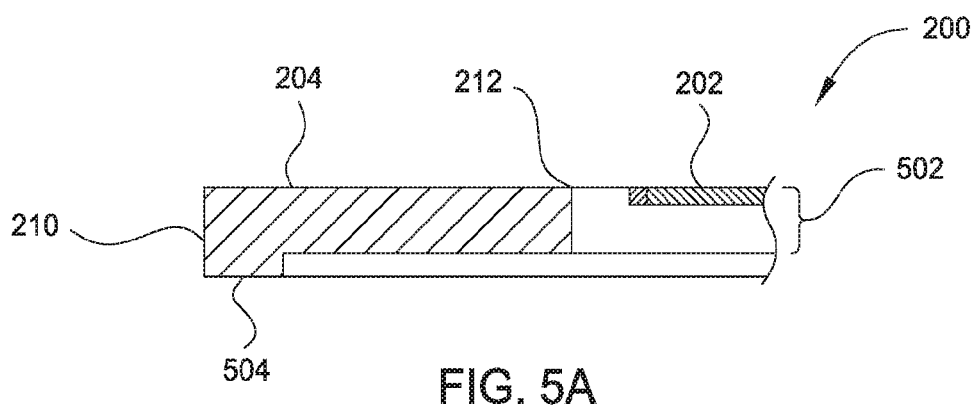
FIG. 5A is a cross-sectional view of the heat shield assembly of FIG. 2.

FIG. 5A is a cross-sectional view of the heat shield assembly 200 taken at the second line labeled 5A in FIG. 2. The preheat member 204 may have an edge extension 504 that may be used to engage the preheat member 204 with another chamber component, such as a chamber liner (not shown). The edge extension 504 may provide centering for the heat shield assembly 200. The heat shield member 202 is visible in the background. The heat shield member may have a thickness between about 0.1 mm and about 1.5 mm, such as between about 0.6 mm and about 0.8 mm, for example about 0.7 mm, 0.75 mm, 0.78 mm, or 0.79 mm. The thickness of the heat shield member 202 is typically selected based on the thermal properties desired for the heat shield member. The preheat member 204 has a thickness 502 between about 2.0 mm and about 10.0 mm, such as between about 3.0 mm and about 6.0 mm, for example about 5.0 mm or about 5.5 mm. The edge extension 504 may extend below the body of the preheat member 204 between about 0.5 mm and about 3.5 mm, for example about 1.0 mm. The heat shield member 202 may be made of any material capable of withstanding processing conditions likely to be used in the processing chamber 100. Exemplary materials include quartz, sapphire, silicon, graphite, silicon carbide, ceramics, or combinations thereof. The heat shield member 202 may have a coating made of any of the above, as well. For example, the heat shield member may be made of silicon carbide or silicon carbide coated graphite. The preheat member 204 may be made of any of the above materials, as well. For example, the preheat member 204 may be made of silicon carbide or silicon carbide coated graphite.

Figure 5B:
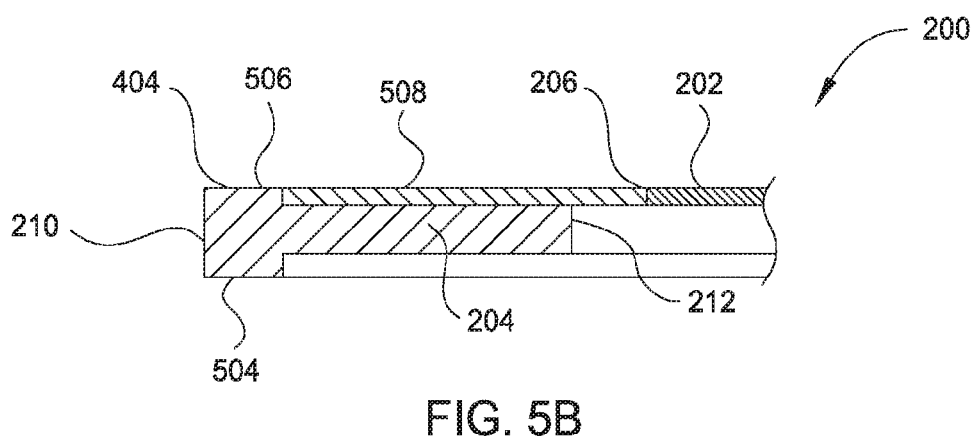
FIG. 5B is another cross-sectional view of the heat shield assembly of FIG. 2.

FIG. 5B is a cross-sectional view of the heat shield assembly 200 taken at the section line labeled 5B in FIG. 2. The heat shield member 202 is visible, where the inner radius 206 of the heat shield member 202 can be seen extending inward beyond the inner radius 212 of the preheat member 204. The rim portion 404 is also visible. As shown in FIG. 5B, an upper surface 506 of the rim portion 404 is substantially coplanar with an upper surface 508 of the heat shield member 202. In the embodiment of FIG. 5B the heat shield member 202 is shown in substantially continuous contact with the preheat member 204.

Figure 5C:
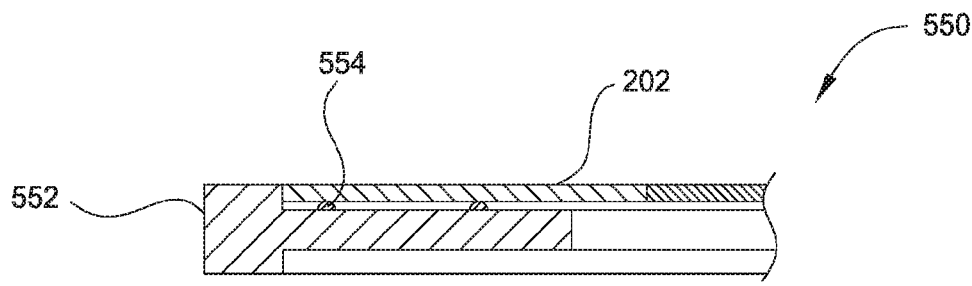
FIG. 5C is a cross-sectional view of a heat shield assembly according to another embodiment.

FIG. 5C is a cross-sectional view of a heat shield assembly 550 according to another embodiment. The cross-sectional view of the heat shield assembly 550 is taken at a similar location as the cross-section of FIG. 5B. The heat shield member 202 is coupled with a preheat member 552 that has reduced contact features 554 to minimize direct contact between the heat shield member 202 and the preheat member 552. Reduced contact between the heat shield member and the preheat member may be useful in some embodiments to reduce thermal conduction from the preheat member to the heat shield member. The reduced contact features 554 may take the form of ridges formed in the upper surface of the preheat member 552 to contact the lower surface of the heat shield member. Alternately, ridges may be formed in the lower surface of the heat shield member. Reduced contact features may be formed in the preheat member, the heat shield member, or both.

Figure 6:
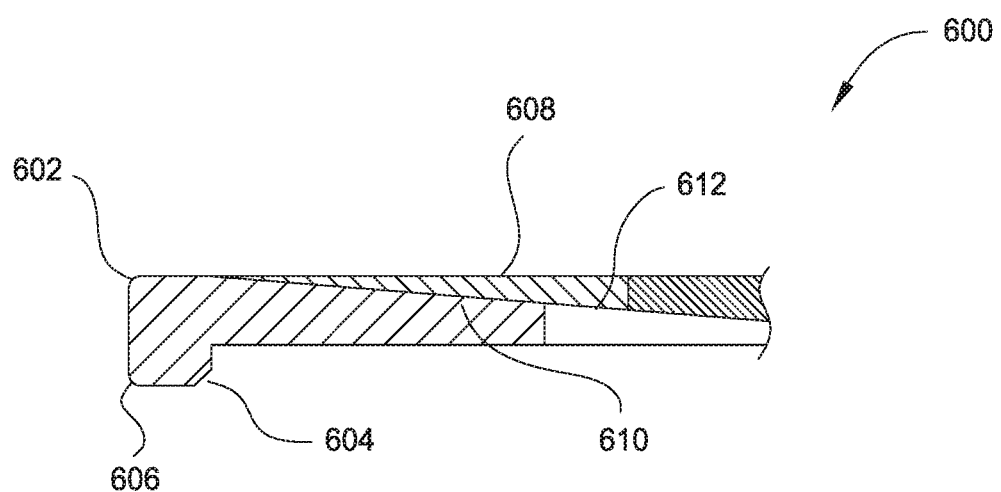
FIG. 6 is a cross-sectional view of a heat shield assembly according to another embodiment.

FIG. 6 is a cross-sectional view of a heat shield assembly 600 according to another embodiment. The heat shield assembly 600 is similar to the heat shield assembly 200, but whereas the heat shield assembly 200 is portrayed in FIG. 5A as having square edges, the heat shield assembly 600 includes some optional structural features, such as rounded edges 602 and chamfered edges 604. The heat shield assembly 600 includes a preheat member 606 and a heat shield member 608 with angled contact surfaces. The preheat member 606 includes an angled surface 610, and the heat shield member 608 includes an angled surface 612 that rests on the angled surface 610.

While the foregoing is directed to certain embodiments, other and further embodiments may be devised without departing from the basic scope of this disclosure.

What is claimed is:

1. A heat shield assembly, comprising:
    an annular heat shield member having a gap that subtends an angle of the heat shield member, wherein the edges of the gap are parallel to a radius of the heat shield member that bisects the angle; and
    an annular preheat member with a recessed portion that receives the heat shield member.

2. The heat shield assembly of claim 1, wherein the gap has two rounded outer corners.

3. The heat shield assembly of claim 2, wherein the rounded corners are circular.

4. The heat shield assembly of claim 1, wherein an inner radius of the preheat member is larger than an inner radius of the heat shield member.

5. The heat shield assembly of claim 1, wherein the preheat member has a rim portion that surrounds the heat shield member.

6. The heat shield assembly of claim 5, wherein the preheat member or the heat shield member has reduced contact features.

7. The heat shield assembly of claim 6, wherein the reduced contact features are ridges.

8. The heat shield assembly of claim 7, wherein the preheat member has a gap from an outer radius to an inner radius thereof.

9. The heat shield assembly of claim 5, wherein the preheat member and the heat shield member both have angled contact surfaces.

10. A heat shield assembly, comprising:
    an annular heat shield member having a gap that subtends an angle of the heat shield member, wherein the edges of the gap are parallel to a radius of the heat shield member that bisects the angle; and
    an annular preheat member with a recessed portion that receives the heat shield member and a gap from an outer radius to an inner radius of the preheat member.

11. The heat shield assembly of claim 10, wherein the preheat member or the heat shield member has reduced contact features.

12. The heat shield assembly of claim 10, wherein the preheat member and the heat shield member both have angled contact surfaces.

13. The heat shield assembly of claim 11, wherein the reduced contact features are ridges.

14. The heat shield assembly of claim 13, wherein the preheat member has a rim portion that surrounds the heat shield member.

15. A heat shield assembly, comprising:
    an annular heat shield member having a gap that subtends an angle of the annular member, the gap having edges parallel to a radius of the heat shield member that bisects the subtended by the gap, wherein the gap has rounded corners; and
    an annular preheat member with a recessed portion that receives the heat shield member, wherein the preheat member has a rim portion that surrounds the heat shield member.

16. The heat shield assembly of claim 15, wherein an inner radius of the preheat member is larger than an inner radius of the heat shield member.

17. The heat shield assembly of claim 15, wherein the rounded corners are circular.

18. The heat shield assembly of claim 15, wherein the preheat member or the heat shield member has reduced contact features, and wherein the reduced contact features are ridges.

19. The heat shield assembly of claim 15, wherein the preheat member and the heat shield member both have angled contact surfaces.

* * * * *